(12) United States Patent
Matsumoto et al.

(10) Patent No.: US 7,849,864 B2
(45) Date of Patent: Dec. 14, 2010

(54) LIQUID PROCESSING SYSTEM

(75) Inventors: Kazuhisa Matsumoto, Koshi (JP); Satoshi Kaneko, Koshi (JP); Masami Akimoto, Koshi (JP); Takayuki Toshima, Koshi (JP); Norihiro Ito, Koshi (JP)

(73) Assignee: Tokyo Electron Limited, Tokyo (JP)

( * ) Notice: Subject to any disclaimer, the term of this patent is extended or adjusted under 35 U.S.C. 154(b) by 213 days.

(21) Appl. No.: 11/878,385

(22) Filed: Jul. 24, 2007

(65) Prior Publication Data

US 2008/0023049 A1 Jan. 31, 2008

(30) Foreign Application Priority Data

Jul. 26, 2006 (JP) ............... 2006-203981

(51) Int. Cl.
*B08B 3/00* (2006.01)
(52) U.S. Cl. ..................................... 134/61
(58) Field of Classification Search .................. 134/61
See application file for complete search history.

(56) References Cited

U.S. PATENT DOCUMENTS 5,937,223 A * 8/1999 Akimoto et al. ............ 396/604

2003/0066797 A1* 4/2003 Sasaki ...................... 210/511
2004/0179173 A1* 9/2004 Nakamura et al. ............ 355/27
2006/0201363 A1* 9/2006 Nakatsukasa et al. ........ 101/483

FOREIGN PATENT DOCUMENTS

JP 2005-093769 4/2005
WO WO2005015625 * 2/2005

* cited by examiner

*Primary Examiner*—Michael Cleveland
*Assistant Examiner*—Samuel A Waldbaum
(74) *Attorney, Agent, or Firm*—Smith, Gambrell & Russell, LLP

(57) ABSTRACT

A liquid processing system includes a liquid processing section including liquid processing units horizontally disposed therein and each configured to perform a liquid process while supplying a process liquid onto a substrate; a process liquid storing section that stores the process liquid to be supplied to the liquid processing units of the liquid processing section; and a piping unit including a supply pipe configured to guide the process liquid from the process liquid storing section to the liquid processing units. The process liquid storing section, the piping unit, and the liquid processing section are disposed inside a common casing in this order from below. The supply pipe of the piping unit has a horizontal pipe portion horizontally extending along an array direction of the liquid processing units, such that the process liquid is supplied from the horizontal pipe portion to the liquid processing units individually.

20 Claims, 6 Drawing Sheets

LIQUID PROCESSING SYSTEM

BACKGROUND OF THE INVENTION

1. Field of the Invention

The present invention relates to a liquid processing system for performing a predetermined liquid process, such as a cleaning process, on a substrate, such as a semiconductor wafer.

2. Description of the Related Art

In the process of manufacturing semiconductor devices or flat panel display devices (FPD), liquid processes are frequently used, in which a process liquid is supplied onto a target substrate, such as a semiconductor wafer or glass substrate. For example, processes of this kind encompass a cleaning process for removing particles and/or contaminants deposited on a substrate, and a coating process for applying a photo-resist liquid or development liquid in a photolithography stage.

As a liquid processing system used for this purpose, there is a system comprising a plurality of processing units of the single-substrate processing type and a transfer unit for transferring substrates to and from the processing units. Each of the processing units is structured such that a substrate, such as a semiconductor wafer, is held on a spin chuck, and a process liquid is supplied onto the front surface or front and back surfaces of the wafer, while the wafer is rotated. In order to realize a high throughput while suppressing an increase in the footprint of a system, an arrangement frequently used comprises processing units stacked one on the other to form a multi-layer structure (for example, Jpn. Pat. Appln. KOKAI Publication No. 2005-93769).

In a liquid processing system of this kind, process liquid supply units for supplying process liquids (chemical solutions) are disposed for the respective process liquids to circulate and supply the respective process liquids. However, where a plurality of processing units are stacked one on the other, the piping layout for circulating and supplying process liquids inevitably brings about up-and-down portions of pipes. Consequently, the piping layout becomes complicate and occupies a large space. Further, the distances from processing units to the collective exhaust/drain system differ from each other between processing units, which may make it difficult to perform a uniform process between the processing units.

BRIEF SUMMARY OF THE INVENTION

An object of the present invention is to provide a liquid processing system including a plurality of processing units, which allows the occupied space to be further decreased.

Another object of the present invention is to provide a liquid processing system including a plurality of processing units, which allows the process performed in the processing units to be uniform between them.

According to a first aspect of the present invention, there is provided a liquid processing system comprising: a liquid processing section including a plurality of liquid processing units horizontally disposed therein and each configured to perform a liquid process while supplying a process liquid onto a substrate; a process liquid storing section that stores the process liquid to be supplied to the plurality of liquid processing units of the liquid processing section; and a piping unit including a supply pipe configured to guide the process liquid from the process liquid storing section to the plurality of liquid processing units, wherein the process liquid storing section, the piping unit, and the liquid processing section are disposed inside a common casing in this order from below, and the supply pipe of the piping unit has a horizontal pipe portion horizontally extending along an array direction of the plurality of liquid processing units, such that the process liquid is supplied from the horizontal pipe portion to the liquid processing units individually.

In the first aspect, the liquid processing units may be connected to the horizontal pipe portion respectively by pipe portions respectively provided with valves. The piping unit may further include a drain pipe configured to guide the process liquid discharged from the liquid processing units and having a horizontal pipe portion extending in parallel with the horizontal pipe portion of the supply pipe. In this case, the liquid processing system may further comprise a recycling mechanism configured to collect and recycle at least part of the process liquid flowing through the drain pipe. The piping unit may further include an exhaust pipe configured to guide exhaust gas out of the system from the liquid processing units and having a horizontal pipe portion extending in parallel with the horizontal pipe portion of the supply pipe.

The piping unit may comprise a box horizontally disposed, through which the horizontal pipe portion extends. In this case, the liquid processing system may further comprise an exhaust pipe configured to exhaust gas from inside the box. The liquid processing section may be provided with a driving area in which driving systems of the plurality of liquid processing units may be disposed together. In this case, the liquid processing system may further comprise an exhaust pipe configured to exhaust gas from inside the driving area. The liquid processing system may further comprise a substrate I/O section disposed adjacent to the liquid processing section and configured to place thereon a substrate storage container for storing a plurality of substrates, wherein the substrate I/O section is configured to transfer a substrate from inside the substrate storage container to the liquid processing section, and to transfer a processed substrate from the liquid processing section into the substrate storage container.

In the first aspect, the liquid processing system may be arranged such that the plurality of liquid processing units comprise first and second rows of liquid processing units arrayed in parallel with each other, the horizontal pipe portion comprises first and second horizontal pipe portions horizontally extending along array directions of the first and second rows of liquid processing units, respectively, and the first and second horizontal pipe portions are connected to each other by a connecting pipe portion, such that the process liquid flows from the process liquid storing section, through the first horizontal pipe portion, the connecting pipe portion, and the second horizontal pipe portion, in this order.

In this case, the first horizontal pipe portion, the connecting pipe portion, and the second horizontal pipe portion may form a circulation passage for circulating the process liquid relative to the process liquid storing section. A transfer passage may be interposed between the first and second rows of liquid processing units, and the liquid processing system may further comprise a transfer mechanism configured to travel along the transfer passage and to transfer a substrate to the first and second rows of liquid processing units. The connecting pipe portion may extend below the transfer passage. The transfer passage may be formed in an area having a bottom located below a bottom of an area in which the piping unit is disposed. The liquid processing system may further comprise a fan/filter unit configured to supply clean air into the transfer passage, wherein each of the liquid processing units comprises an inlet portion for introducing the clean air from the transfer passage.

According to a second aspect of the present invention, there is provided a liquid processing system comprising: a liquid processing section including a plurality of liquid processing units horizontally disposed therein and each configured to perform a liquid process while supplying a process liquid onto a substrate, the plurality of liquid processing units comprising first and second rows of liquid processing units arrayed with a transfer passage interposed therebetween; a transfer mechanism configured to travel along the transfer passage and to transfer a substrate to the first and second rows of liquid processing units; a process liquid storing section that stores the process liquid to be supplied to the plurality of liquid processing units of the liquid processing section; and a piping unit including a supply pipe configured to guide the process liquid from the process liquid storing section to the plurality of liquid processing units, wherein the process liquid storing section, the piping unit, and the liquid processing section are disposed inside a common casing in this order from below, and the supply pipe of the piping unit has first and second horizontal pipe portions horizontally extending along array directions of the first and second rows of liquid processing units, respectively, and connected to each other by a connecting pipe portion, such that the process liquid flows from the process liquid storing section, through the first horizontal pipe portion, the connecting pipe portion, and the second horizontal pipe portion, in this order, while the process liquid is supplied from the first and second horizontal pipe portions to the liquid processing units individually.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate embodiments of the invention, and together with the general description given above and the detailed description of the embodiments given below, serve to explain the principles of the invention.

DETAILED DESCRIPTION OF THE INVENTION

Figure 1:
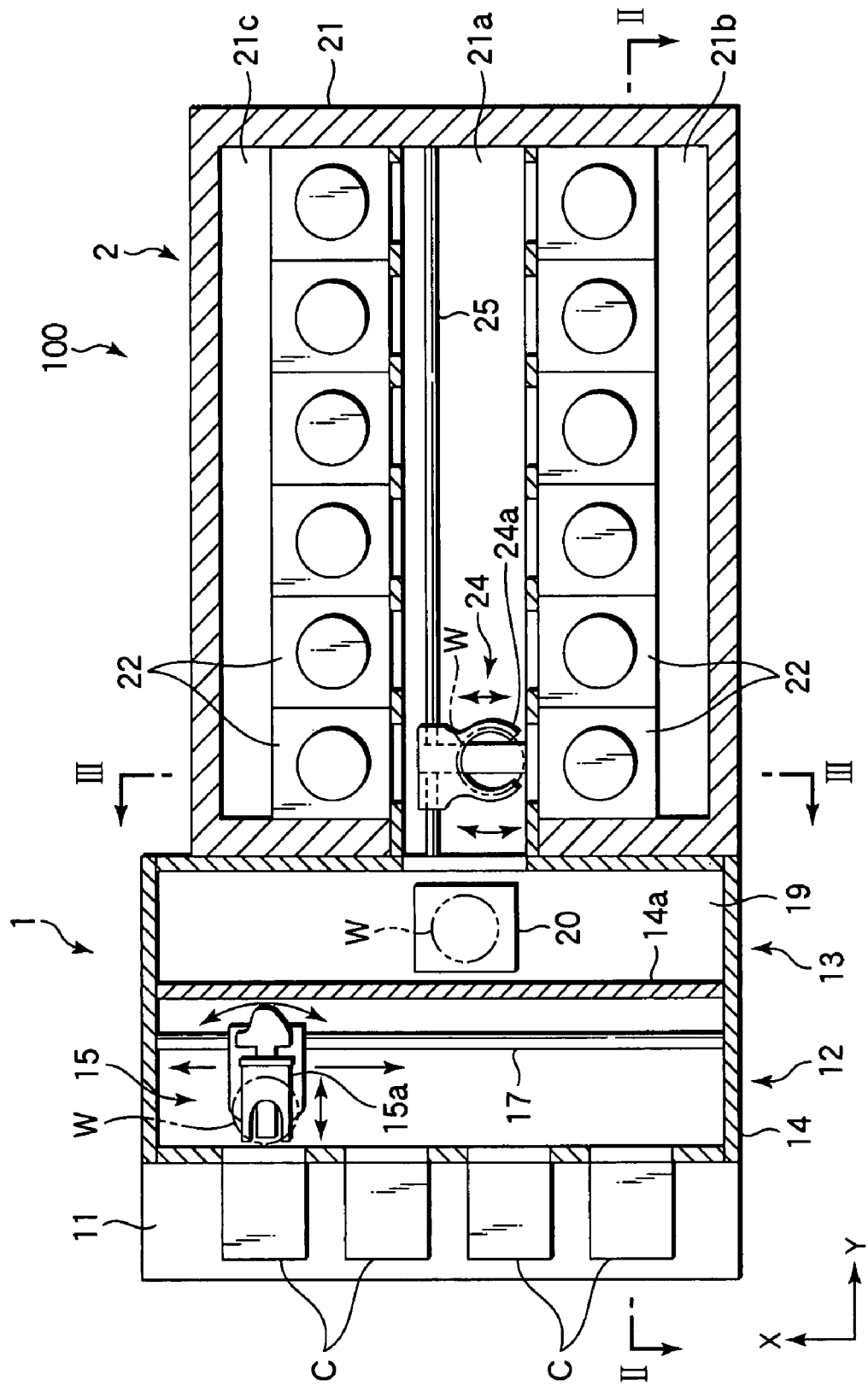
FIG. 1 is a plan view schematically showing the structure of a liquid processing system according to an embodiment of the present invention.

An embodiment of the present invention will now be described with reference to the accompanying drawings. In the following description, the constituent elements having substantially the same function and arrangement are denoted by the same reference numerals, and a repetitive description will be made only when necessary. Hereinafter, an explanation will be given of a case where the present invention is applied to a liquid processing system that can perform a cleaning process on the front and back surfaces of a semiconductor wafer (which will be simply referred to as "wafer", hereinafter).

Figure 2:
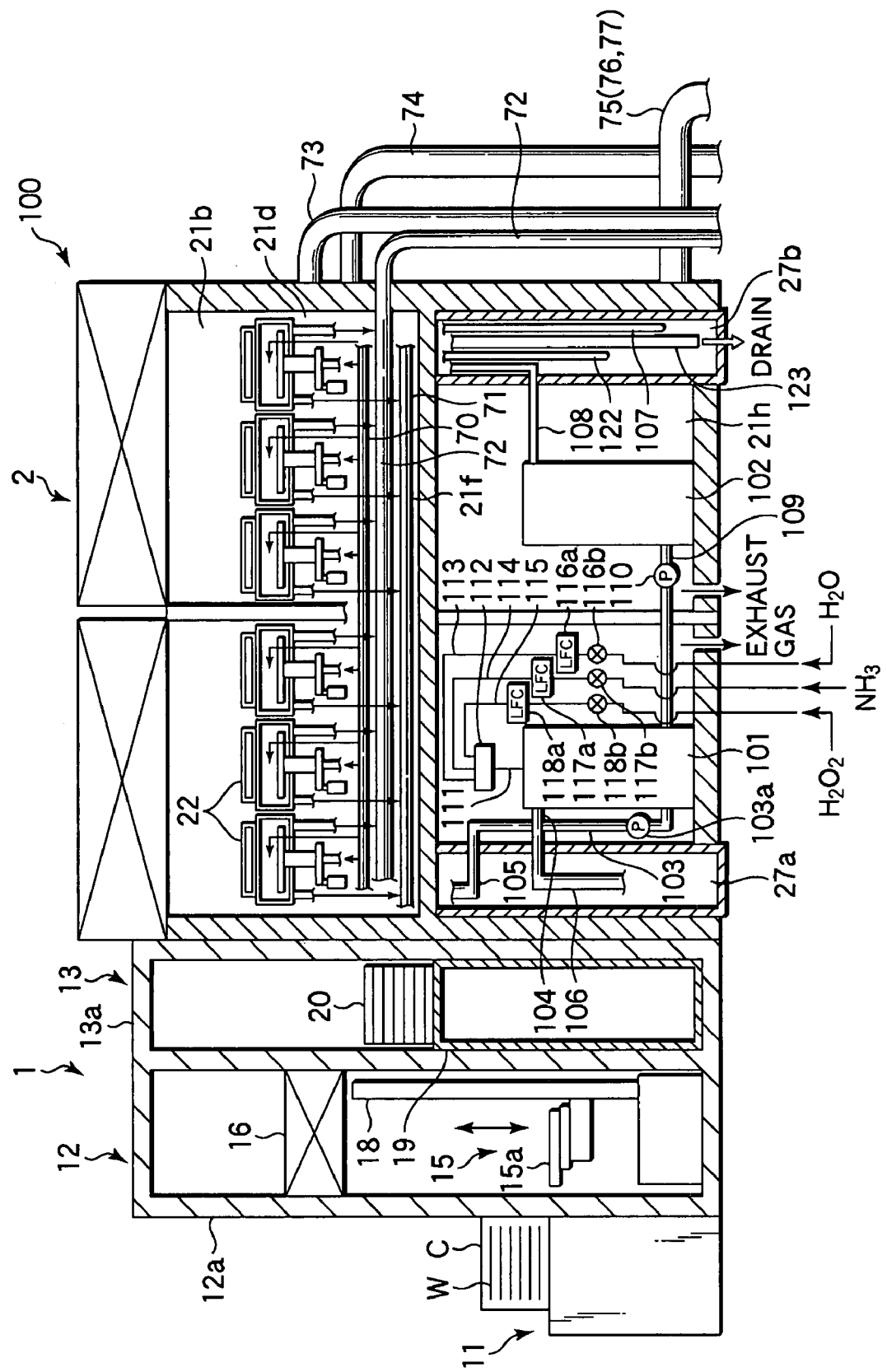
FIG. 2 is a sectional front view taken along line II-II in FIG. 1.
Figure 3:
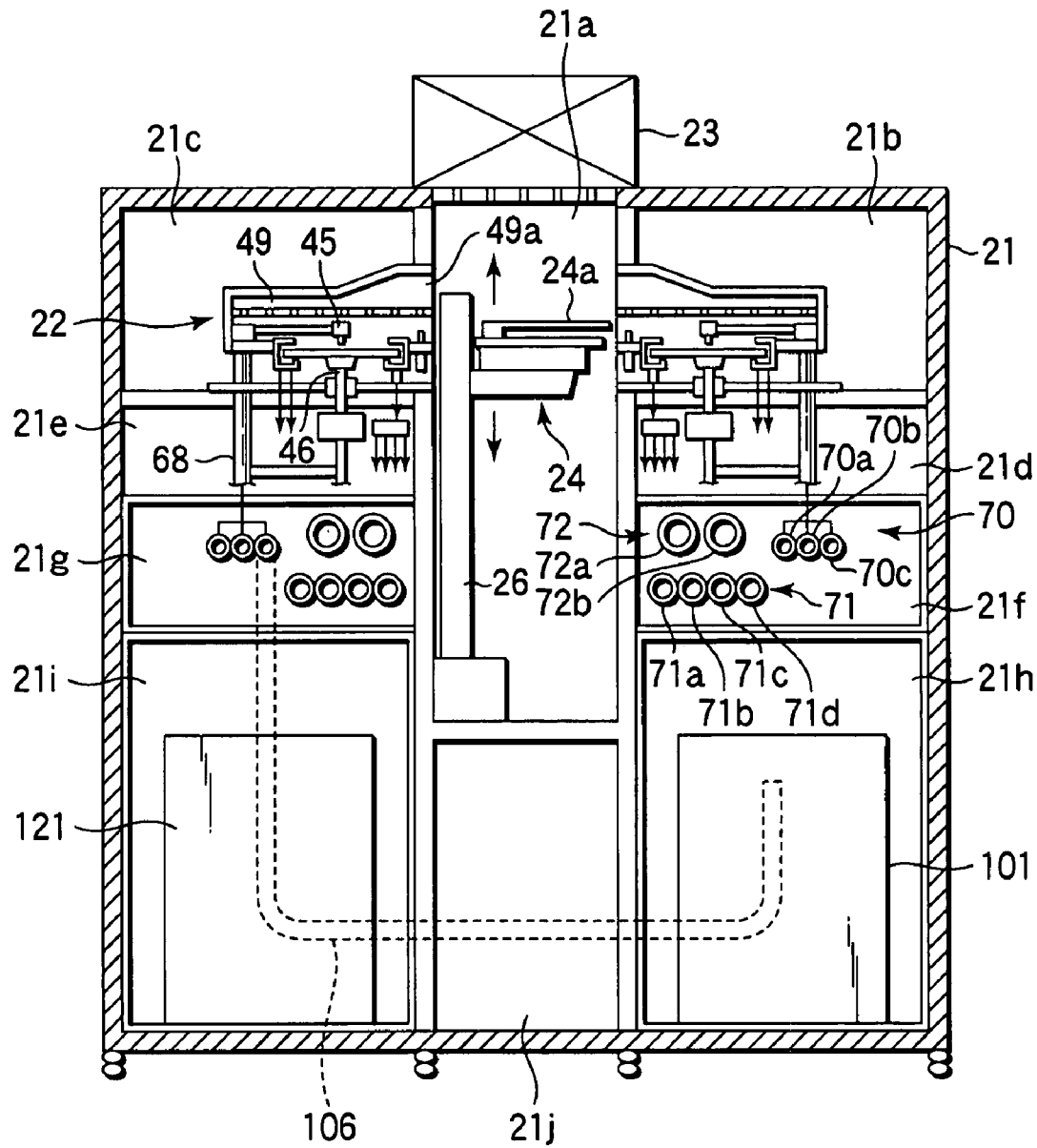
FIG. 3 is a sectional side view taken along line III-III in FIG. 1.

FIG. 1 is a plan view schematically showing the structure of a liquid processing system according to an embodiment of the present invention. FIG. 2 is a sectional front view taken along line II-II in FIG. 1. FIG. 3 is a sectional side view taken along line III-III in FIG. 1.

The liquid processing system 100 include an I/O (in/out) station (substrate I/O section) 1 and a process station (liquid processing section) 2 disposed adjacent to each other. The I/O station 1 is configured to place thereon wafer carriers C each for storing a plurality of wafers W, so as to transfer wafers W to and from the other system. The process station 2 is configured to perform a cleaning process on wafers W.

The I/O station 1 includes a carrier table 11, a transfer zone 12 for transferring wafers W, and a delivery zone 13 for delivering wafers W. A plurality of wafer carriers C each for storing wafers W in a horizontal state can be placed on the carrier table 11. The transfer zone 12 and delivery zone 13 are defined by a casing 14.

Specifically, the carrier table 11 can support four wafer carriers C at a time. Each wafer carrier C placed thereon is set in close contact with a vertical wall of the casing 14, so that the wafers W stored in the carrier C can be transferred into the transfer zone 12 without being exposed to the atmosphere.

The casing 14 has a partition member 14a for vertical partitioning the transfer zone 12 and delivery zone 13 from each other. The transfer zone 12 includes a transfer mechanism 15 and a fan/filter unit (FFU) 16 disposed thereabove to supply clean air as a down flow. The transfer mechanism 15 includes a wafer handling arm 15a for holding a wafer W and a driving mechanism for the same. Specifically, the wafer handling arm 15a is movable back and forth, and is also movable along a horizontal guide 17 (see FIG. 1) extending in an X-direction, i.e., the array direction of the wafer carriers C. The wafer handling arm 15a is further movable along a vertical guide 18 (see FIG. 2) extending in a vertical direction, and is rotatable in a horizontal plane. The transfer mechanism 15 can thereby transfer wafers W between the wafer carriers C and delivery zone 13.

The delivery zone 13 includes a delivery stage 19 and a delivery shelf 20 having a plurality of levels each for holding a wafer W. The delivery shelf 20 is used for delivering and receiving wafers W to and from the process station 2.

The process station 2 is defined by a rectangular casing 21. The casing 21 includes a transfer chamber 21a at the top of the center for forming a transfer passage extending in a Y-direction that is perpendicular to the X-direction or the array direction of the wafer carriers C. The transfer chamber 21a is sandwiched between two unit-accommodating chambers 21b and 21c. Each of the unit-accommodating chambers 21b and 21c includes six liquid processing units 22 horizontal arrayed along the transfer chamber 21a, so the totally number of liquid processing units 22 is twelve.

In the casing 21, driving areas 21d and 21e for accommodating the driving systems of the liquid processing units 22 are respectively disposed below the unit-accommodating chambers 21b and 21c. Piping boxes 21f and 21g for accommodating pipes are respectively disposed below the driving areas 21d and 21e. Further, chemical solution supply units 21h and 21i used as process liquid storing sections are respectively disposed below the piping boxes 21f and 21g. On the other hand, an exhaust space 21j for exhausting gas is disposed below the transfer chamber 21a.

The transfer chamber 21a is provided with a fan/filter unit (FFU) 23 disposed thereabove to supply clean air as a down flow into the transfer chamber 21a. A transfer mechanism 24 is disposed inside the transfer chamber 21a. The transfer mechanism 24 includes a wafer handling arm 24a for holding a wafer W and a driving mechanism for the same. Specifically, the wafer handling arm 24a is movable back and forth, and is also movable along a horizontal guide 25 (see FIG. 1) extending in the Y-direction inside the transfer chamber 21a. The wafer handling arm 24a is further movable along a vertical guide 26 (see FIG. 3) extending in a vertical direction, and is rotatable in a horizontal plane. The transfer mechanism 24 can thereby transfer wafers W to and from the respective liquid processing units 22.

The delivery stage 19 is located at a position higher than the carrier table 11, and the liquid processing units 22 are located at positions higher than the delivery stage 19.

Each of the piping boxes 21f and 21g accommodates a process liquid pipe group 70, a drain pipe group 71, and an exhaust pipe group 72 in a horizontal state. The process liquid pipe group 70 includes an SC1 pipe 70a for supplying ammonia hydrogen peroxide solution (SC1) prepared by mixing ammonia water and hydrogen peroxide, a DHF pipe 70b for supplying dilute hydrofluoric acid (DHF), and a purified water pipe 70c for supplying purified water, for example. The drain pipe group 71 includes an acid drain pipe 71a for draining acid drainage, an alkaline drain pipe 71b for draining alkaline drainage, an acid collection pipe 71c for collecting acid, and an alkaline collection pipe 71 for collecting alkaline, for example. The exhaust pipe group 72 includes an acid exhaust pipe 72a for exhausting acid exhaust gas, and an alkaline exhaust pipe 72b for exhausting alkaline exhaust gas.

As shown in FIG. 2, a first vertical pipe area 27a is present adjacent to the chemical solution supply units 21h and 21i on the I/O station 1 side. A second vertical pipe area 27b is present adjacent to the chemical solution supply units 21h and 21i on the other side.

Figure 4:
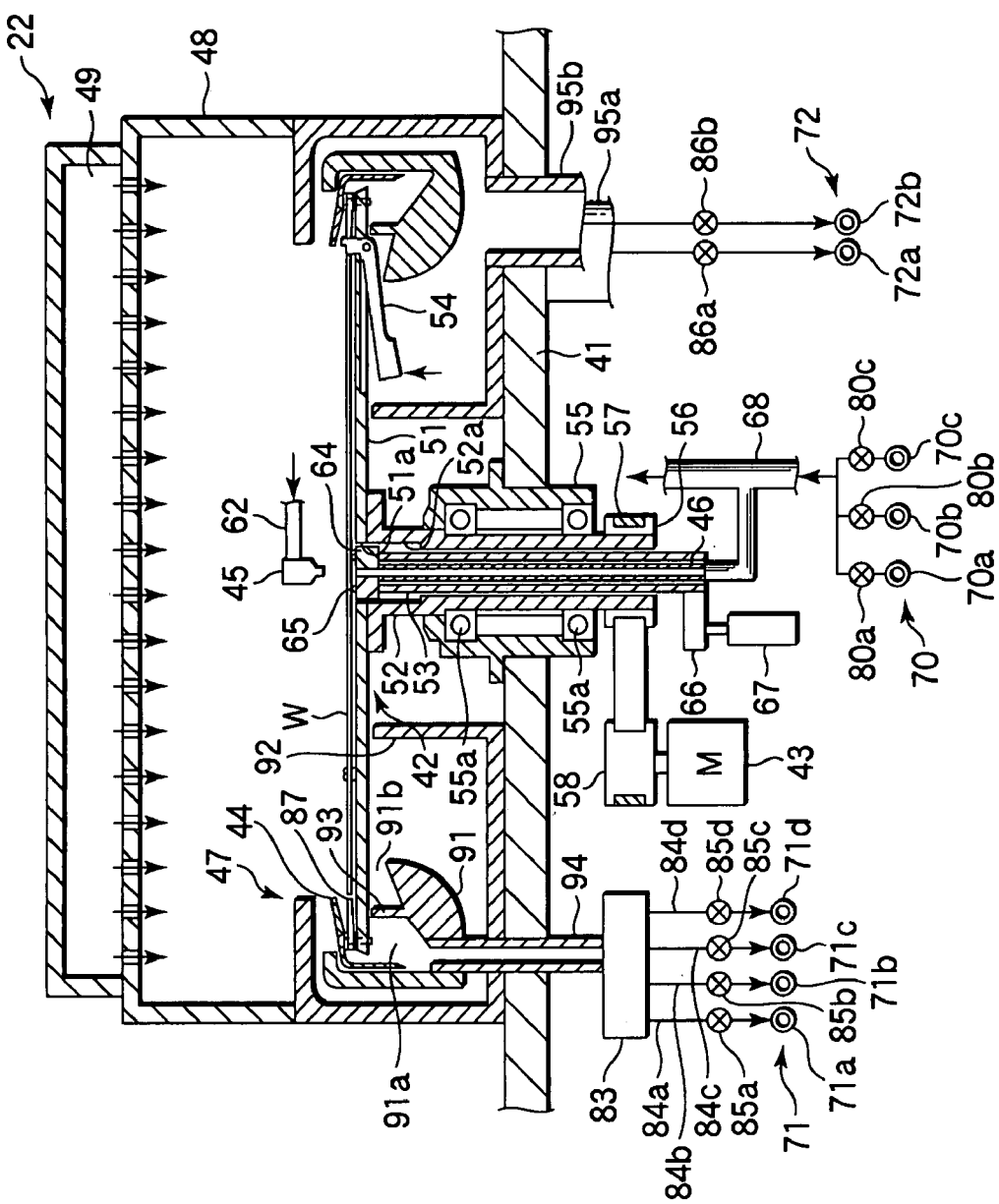
FIG. 4 is a sectional view schematically showing the structure of a liquid processing unit used in the liquid processing system shown in FIG. 1.

As shown in the enlarged view of FIG. 4, each of the liquid processing units 22 includes a base plate 41 and a wafer holding member 42 for rotatably holding a wafer W. The wafer holding member 42 is rotatable by a rotary motor 43. A rotary cup 44 is disposed to surround the wafer W held on the wafer holding member 42 and configured to rotate along with the wafer holding member 42. The liquid processing unit 22 further includes a front surface process liquid supply nozzle 45 for supplying a process liquid onto the front surface of the wafer W, and a back surface process liquid supply nozzle 46 for supplying a process liquid onto the back surface of the wafer W. Further, an exhaust/drain section 47 is disposed around the rotary cup 44. A casing 48 is disposed to cover the area around the exhaust/drain section 47 and the area above the wafer W. The casing 48 is provided with a gas flow inlet portion 49 at the top arranged to receive a gas flow supplied from the fan/filter unit (FFU) 43, so that clean air is supplied as a down flow onto the wafer W held on the wafer holding member 42. As shown in FIG. 3, the gas flow inlet portion 49 has an inlet port 49a connected to the transfer chamber 21a, through which the gas flow is introduced.

The wafer holding member 42 includes a rotary plate 51 formed of a circular plate set in a horizontal state. The center of the bottom of the rotary plate 51 is connected to a cylindrical rotary shaft 52 extending vertically downward. The rotary plate 51 has a circular opening 51a at the center, which communicates with a bore 52a inside the rotary shaft 52. An elevating member 53 supporting the back surface process liquid supply nozzle 46 is movable up and down through the bore 52a and opening 51a. The rotary plate 51 is provided with three holding accessories 54 (only one of them is shown) for holding the outer edge of the wafer W.

The rotary shaft 52 is rotatably supported by the base plate 41 through a bearing mechanism 55 having two bearings 55a. The rotary shaft 52 is provided with a pulley 56 fitted thereon at the lower end. The shaft of the motor 43 is also provided with a pulley 58 fitted thereon. A belt 57 is wound around between these pulleys 56 and 58. The rotary shaft 52 is rotated through the pulley 58, belt 57, and pulley 56 by rotation of the motor 43.

The elevating member 53 includes a wafer support head 64 at the top and is provided with wafer support pins 65 for supporting the wafer W. The lower end of the elevating member 53 is connected to a cylinder mechanism 67 through a connector 66. The elevating member 53 is movable up and down by the cylinder mechanism 67 to move up and down the wafer W for loading and unloading the wafer W.

The front surface process liquid supply nozzle 45 is supported by a nozzle arm 62. The nozzle arm 62 is movable by a driving mechanism (not shown), so that the front surface process liquid supply nozzle 45 is movable between a process liquid supply position above the wafer W and a retreat position outside the wafer W. A process liquid is supplied from the front surface process liquid supply nozzle 45 onto the front surface of the wafer W. The back surface process liquid supply nozzle 46 is vertically disposed at the center inside the elevating member 53. A process liquid is supplied from the back surface process liquid supply nozzle 46 onto the back surface of the wafer W. A process liquid is supplied through a vertical pipe 68 to the front surface process liquid supply nozzle 45 and back surface process liquid supply nozzle 46. The vertical pipe 68 is connected through valves 80a to 80c respectively to the three pipes 70a to 70c of the process liquid pipe group 70 horizontally placed inside the piping box 21f or 21g.

The rotary cup 44 is rotated along with the rotary plate 5, so the process liquid thrown off from the wafer W is prevented from bouncing back to the wafer W while the process liquid is guided downward. A plate-like guide member 87 is disposed between the rotary cup 44 and rotary plate 51 at a height essentially the same as the wafer W. The guide member 87 is arranged such that the upper and lower surfaces thereof are to be almost continued to the front and back surfaces of the wafer W. The guide member 87 prevents the process liquid thrown off from the wafer W from becoming turbulent, thereby preventing mist from being scattered around.

The exhaust/drain section 47 is mainly used for collecting exhaust gas and drainage discharged from the space surrounded by the rotary plate 51 and rotary cup 44. The exhaust/drain section 47 includes an annular drain cup 91 disposed to receive the process liquid discharged from the rotary cup 44, and an annular exhaust cup 92 disposed outside the drain cup 91 to surround the drain cup 91. The drain cup 91 includes a main portion 91a for receiving the process liquid from the rotary cup 44, and a sub portion 91b for receiving the process liquid dropping from the holding accessories 54. The main portion 91a and sub portion 91b are partitioned by a vertical wall 93 for preventing the gas flows from being disturbed.

The drain cup 91 is connected to a drain pipe 94 at the bottom on the outermost side. The drain pipe 94 is connected to a drain-switching member 83, so that process liquids are separately collected in accordance with the types thereof. The drain-switching member 83 is connected to an acid discharge pipe 84a for discharging acid drainage, an alkaline discharge pipe 84b for discharging alkaline drainage, an acid collection pipe 84c for collecting acid, and an alkaline collection pipe 84d for collecting alkaline, all of them extending vertically downward. These pipes are respectively connected to the acid drain pipe 71a, alkaline drain pipe 71b, acid collection pipe 71c, and alkaline collection pipe 71d of the drain pipe group 71. The acid discharge pipe 84a, alkaline discharge pipe 84b, acid collection pipe 84c, and alkaline collection pipe 84d are respectively provided with valves 85a, 85b, 85c, and 85d.

The exhaust cup 92 is configured to mainly collect gas components from inside and around the rotary cup 44 through an annular gap formed between the rotary cup 44 and exhaust cup 92. The exhaust cup 92 is connected at the bottom to an acid exhaust pipe 95a for exhausting acid exhaust gas and an alkaline exhaust pipe 95b for exhausting alkaline exhaust gas. The acid exhaust pipe 95a and alkaline exhaust pipe 95b are respectively connected to the acid exhaust pipe 72a and alkaline exhaust pipe 72b of the exhaust pipe group 72. The acid exhaust pipe 95a and alkaline exhaust pipe 95b are respectively provided with valves 86a and 86b.

As described above, the process liquid is guided by the rotary cup 44 to the drain cup 91, and gas components are guided to the exhaust cup 92. In this case, the liquid-draining from the drain cup 91 is performed independently of the gas-exhausting from the exhaust cup 92, so that drainage and exhaust gas are guided separately from each other. Further, since the exhaust cup 92 is disposed to surround the drain cup 91, mist leaked out of the drain cup 91 is swiftly discharged, so that the mist is reliably prevented from diffusing outside. Accordingly, the distance between the peripheral edge of the wafer W and the drain cup 91 and exhaust cup 92 can be smaller to downsize the liquid processing unit 22.

The chemical solution supply unit 21h includes a first chemical solution tank 101 disposed on the I/O station 1 side, for storing ammonia hydrogen peroxide solution (SC1) prepared by, e.g., mixing ammonia water and hydrogen peroxide (see FIG. 2). The chemical solution supply unit 21h also includes a first recycle tank 102 adjacent to the first chemical solution tank 101 (see FIG. 2).

As shown in FIG. 2, the first chemical solution tank 101 is connected at a lower position of its sidewall to a delivery pipe 103 for delivering the chemical solution from inside. The first chemical solution tank 101 is also connected at an upper position of its sidewall to a return pipe 104 for returning the chemical solution. The delivery pipe 103 is provided with a pump 103a, and is connected to a connection pipe 105 extending from the first vertical pipe area 27a inside the chemical solution supply unit 21h. The connection pipe 105 is connected to one end of the SC1 pipe 70a of the process liquid pipe group 70 horizontally placed inside the piping box 21f. The return pipe 104 is connected to a bridging pipe 106 extending from the first vertical pipe area 27a. On the other hand, the other end of the SC1 pipe 70a is connected to a bridging pipe 107. The bridging pipe 107 extends downward inside the second vertical pipe area 27b.

Figure 5:
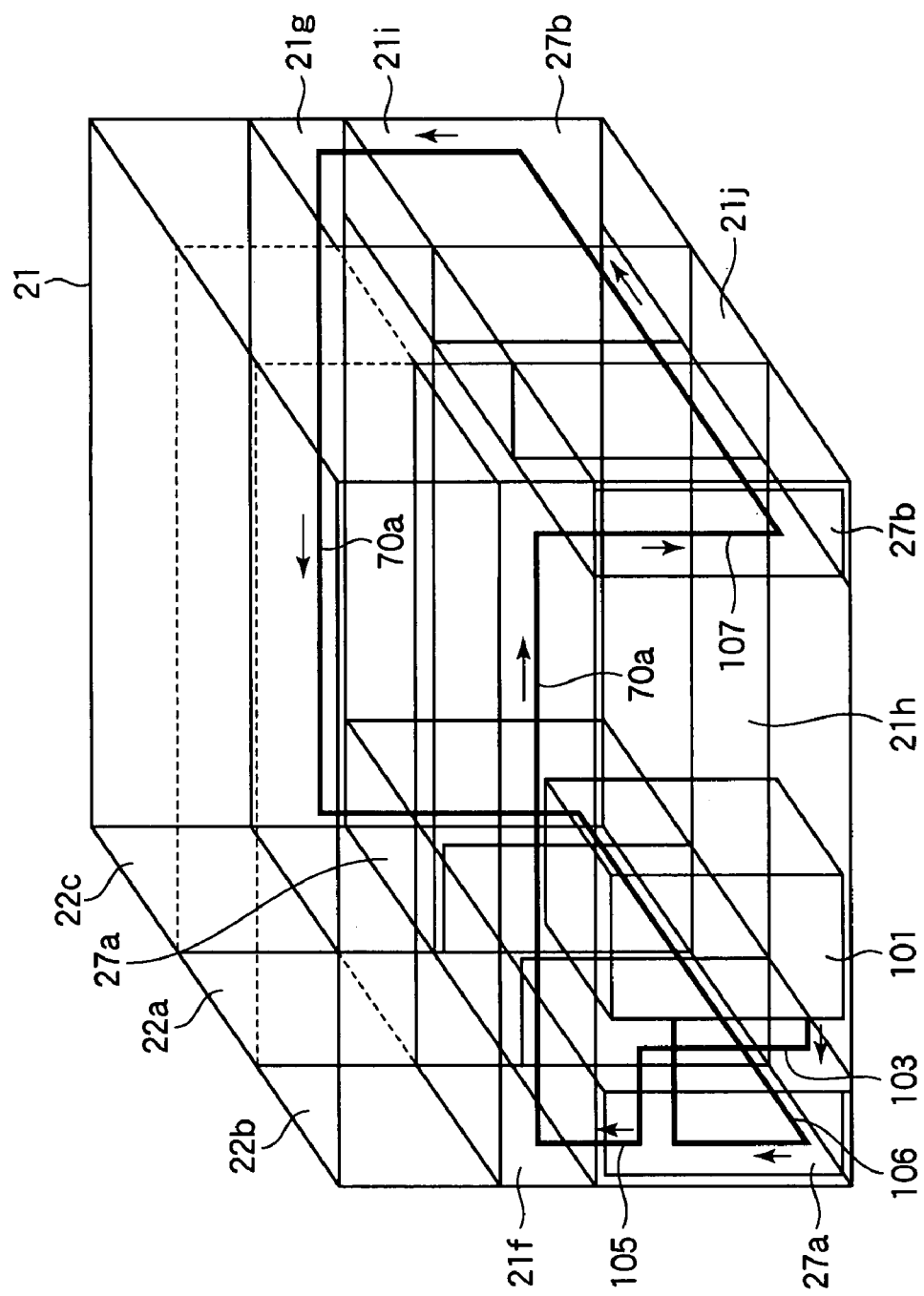
FIG. 5 is a sectional view schematically showing the piping layout of a circulation pipe for circulating SC1 used as a process liquid.

Next, an explanation will be given of the supply route of a chemical solution, including the bridging pipes 106 and 107 with reference to FIGS. 2 and 3 and the perspective view of FIG. 5 schematically showing the process station 2. Specifically, the bridging pipe 107 extends downward inside the second vertical pipe area 27b of the chemical solution supply unit 21h. Then, the pipe 107 extends from a lower position of the second vertical pipe area 27b horizontally through the exhaust space 21j to the second vertical pipe area 27b of the chemical solution supply unit 21i. Then, the pipe 107 extends upward inside the second vertical pipe area 27b of the chemical solution supply unit 21i, and is connected to the SC1 pipe 70a inside the piping box 21g. On the other hand, the bridging pipe 106 extends downward inside the first vertical pipe area 27a of the chemical solution supply unit 21h. Then, the pipe 106 extends from a lower position of the first vertical pipe area 27a horizontally through the exhaust space 21j to the first vertical pipe area 27a of the chemical solution supply unit 21i. Then, the pipe 106 extends upward inside the first vertical pipe area 27a of the chemical solution supply unit 21i, and is connected to the SC1 pipe 70a inside the piping box 21g.

In other words, the SC1 inside the first chemical solution tank 101 flows through the delivery pipe 103 and connection pipe 105 into the SC1 pipe 70a inside the piping box 21f. Then, the SC1 flows through the SC1 pipe 70a inside the piping box 21f, while it is supplied into the respective liquid processing units 22 inside the unit-accommodating chamber 21b individually. Further, the SC1 flows through the bridging pipe 107 into the SC1 pipe 70a inside the piping box 21g. Then, the SC1 flows through the SC1 pipe 70a inside the piping box 21g, while it is supplied into the respective liquid processing units 22 inside the unit-accommodating chamber 21c individually. Further, the SC1 flows through the bridging pipe 106 and return pipe 104 back to the first chemical solution tank 101. A circulation passage of the SC1 is thus formed from the first chemical solution tank 101.

On the other hand, as shown in FIG. 2A, the first recycle tank 102 is connected to a pipe 108 for collecting the used chemical solution. The pipe 108 extends vertically inside the second vertical pipe area 27b, and is connected to the alkaline collection pipe 71d of the drain pipe group 71. Accordingly, alkaline drainage discharged from the liquid processing units 22 is collected.

The first recycle tank 102 is connected to the first chemical solution tank 101 through a connection pipe 109. The connection pipe 109 is provided with a pump 110, so that the chemical solution collected to the first recycle tank 102 can be returned to the first chemical solution tank 101 after the chemical solution is purified.

The first chemical solution tank 101 is connected at its top to a mixer 112 through a chemical solution supply pipe 111. The mixer 112 is connected to a purified water pipe 113, an ammonia pipe 114, and a hydrogen peroxide pipe 115. The mixer 112 is configured to form ammonia hydrogen peroxide solution by mixing purified water, ammonia, and hydrogen peroxide, and then supply the solution to the first chemical solution tank 101. The purified water pipe 113 is provided with a flow rate controller (LFC) 116a and a valve 116b. The ammonia pipe 114 is provided with a flow rate controller (LFC) 117a and a valve 117b. The hydrogen peroxide pipe 115 is provided with a flow rate controller (LFC) 118a and a valve 118b.

For example, the chemical solution supply unit 21i includes a second chemical solution tank 121 (see FIG. 3) disposed on the I/O station 1 side, for storing dilute hydrofluoric acid (DHF). The chemical solution supply unit 21i also includes a second recycle tank (not shown) adjacent to the second chemical solution tank 121. As in the SC1 from the first chemical solution tank 101, the DHF from the second chemical solution tank 121 can be also circulated and supplied through the DHF pipes 70b inside the piping boxes 21f and 21g and bridging pipes. Further, as in the SC1 being collected to the first recycle tank 102, the DHF can be also collected to the second recycle tank through the acid collection pipe 71c and a pipe 122 (see FIG. 2).

In addition to a cleaning process by use of these chemical solutions, a rinsing and drying process is performed by use of purified water. At this time, purified water is supplied from a purified water source (not shown) through the purified water pipe 70c. Further, although not shown, a drying gas, such as N₂ gas, can be supplied from the nozzles 45 and 46.

Of the drain pipe group 71 disposed inside each of the piping boxes 21f and 21g, the acid drain pipe 71a and alkaline drain pipe 71b are respectively connected to drain pipes 123 (only one of them is shown in FIG. 2). The drain pipes 123 extend downward through the first vertical pipe area 27a. The drainage from the acid drain pipe 71a and alkaline drain pipe 71b is discharged through the drain pipes 123 to a factory pipe disposed under the floor.

Figure 6:
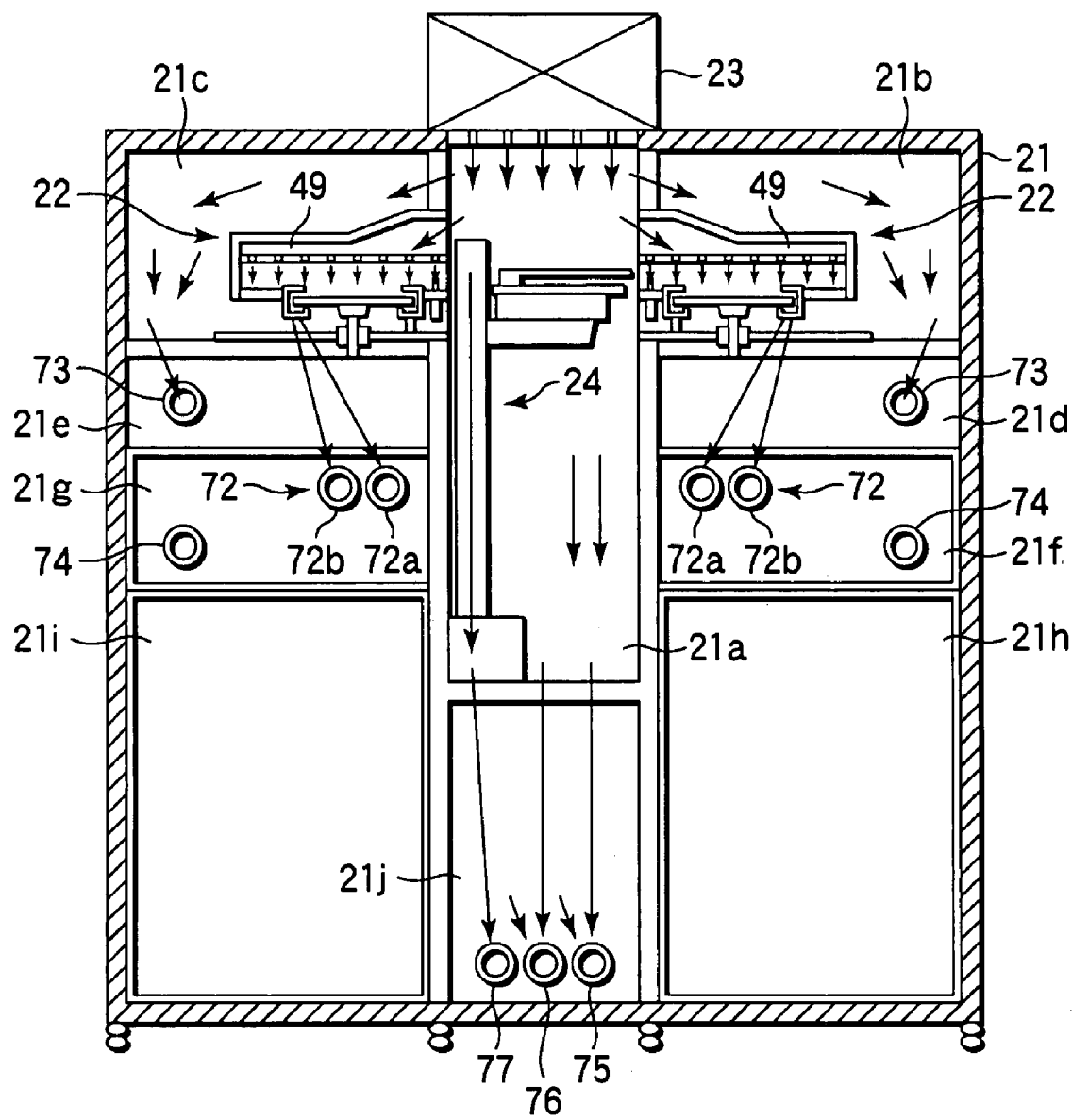
FIG. 6 is a sectional view of the liquid processing system shown in FIG. 1, for explaining the gas supply/exhaust system thereof.

FIG. 6 is a sectional view of the liquid processing system 100 shown in FIG. 1, for explaining the gas supply/exhaust system thereof.

Clean air is supplied from the FFU 23 into the transfer chamber 21a, and part of the clean air is introduced from the transfer chamber 21a into the unit-accommodating chambers 21b and 21c and the gas flow inlet portions 49 of the liquid processing units 22. Clean air flowing into the unit-accommodating chambers 21b and 21c further flows into the driving areas 21d and 21e. The driving areas 21d and 21e are connected to exhaust pipes 73. Where particles are generated inside the unit-accommodating chambers 21b and 21c and inside the driving areas 21d and 21e mainly from the driving systems, the particles are forcibly exhausted through the exhaust pipes 73.

Clean air introduced through the gas flow inlet portions 49 is supplied onto wafers W inside the liquid processing units 22, as described above. Further, acid exhaust gas and alkaline exhaust gas are respectively exhausted from the exhaust cups 92 of the liquid processing units 22 to the acid exhaust pipe 72a and alkaline exhaust pipe 72b of the exhaust pipe group 72 disposed inside each of the piping boxes 21f and 21g, as described above. The piping boxes 21f and 21g are connected to exhaust pipes 74 for exhausting gas from inside. The exhaust space 21j is connected at its bottom to two exhaust pipes 75 and 76 for exhausting gas flowing inside the transfer chamber 21a. The exhaust space 21j is further connected to an exhaust pipe 77 for the transfer/driving system, for exhausting gas flowing through the transfer mechanism 24.

As shown in FIG. 2, the exhaust pipe group 72, the exhaust pipes 73, 74, 75, and 76, and the exhaust pipe 77 for the transfer/driving system extend outward from a sidewall of the casing 21. Then, these pipes extend downward, and are connected to a factory pipe disposed under the floor.

When the liquid processing system 100 having the structure described above are used, the system 100 is controlled as follows. Specifically, a wafer W is first taken out by the transfer mechanism 15 from a carrier C placed on the carrier table 11 of the I/O station 1, and is transferred onto a support portion of the delivery shelf 20 of the delivery stage 19. A plurality of wafers W are placed on the delivery shelf 20 by repeating the operation described above. The wafers W placed on support portions of the delivery shelf 20 are sequentially transferred one by one by the transfer mechanism 24 of the process station 2 into selected ones of the liquid processing units 22.

In each of the liquid processing units 22, the wafer W is chucked by the holding accessories 14, and the wafer holding member 42 is then rotated by the motor 43 along with the rotary cup 44 and wafer W. At the same time, a process liquid is supplied from the front surface process liquid supply nozzle 45 and back surface process liquid supply nozzle 46 to perform a cleaning process on the front and back surfaces of the wafer W. As the process liquid, one or both of the cleaning chemical solutions, i.e., SC1 and DHF, are used. Where the SC1 is used for cleaning, the SC1 is circulated from the first chemical solution tank 101 through the delivery pipe 103, connection pipe 105, SC1 pipe 70a (inside the piping box 21f), bridging pipe 107, SC1 pipe 70a (inside the piping box 21g), bridging pipe 106, and return pipe 104 back to the first chemical solution tank 101. While the SC1 is thus circulated, the SC1 is supplied into the respective liquid processing units 22 individually from the SC1 pipes 70a. Where the DHF is used for cleaning, the DHF is circulated from the second chemical solution tank 121 through pipes including the DHF pipes 70b inside the piping boxes 21f and 21g, as in the circulation of the SC1. While the DHF is thus circulated, the DHF is supplied into the respective liquid processing units 22 individually from the DHF pipes 70b. After the cleaning process described above is performed, purified water is supplied from the purified water pipe 70c into the respective processing units 22 individually to perform purified water rinsing. Thereafter, as needed, N₂ drying is performed, thereby completing the cleaning process.

During this cleaning process, the used process liquids are discharged from the drain cup 91 into the drain pipe group 71, and the acid and alkaline thereof are partly collected and partly discarded. Further, gas components generated during the process are discharged from the exhaust cup 92 into the exhaust pipe group 72, and are then exhausted.

After the liquid process, wafers W are respectively transferred by the transfer mechanism 24 out of the liquid processing units 22, and are placed on the delivery shelf 20 of the delivery stage 19. These wafers W are returned by the transfer mechanism 15 from the delivery shelf 20 into a wafer carrier C.

As described above, according to this embodiment, a plurality of liquid processing units 22 are horizontally placed inside the unit-accommodating chambers 21b and 21c of the casing 21. The piping boxes 21f and 21g are disposed below the unit-accommodating chambers 21b and 21c. The chemical solution supply units 21h and 21i are disposed below the piping boxes 21f and 21g. The process liquid pipe group 70 is horizontally placed inside each of the piping boxes 21f and 21g, and process liquids are supplied from the process liquid pipes of the process liquid pipe group 70 into the liquid processing units 22 individually. Consequently, the number of up-and-down portions of pipes can be decreased as far as possible to provide a compact piping layout, which allows the occupied space to be further decreased, and allows the process performed in the liquid processing units 22 to be uniform between them. Further, the drain pipe group 71 for draining the process liquids discharged from the liquid processing units 22 and the exhaust pipe group 72 for guiding exhaust gas out of the system from the liquid processing units 22 are also horizontally placed inside each of the piping boxes 21f and 21g. Consequently, the piping space can be further compact.

The transfer chamber 21a is interposed between the unit-accommodating chambers 21b and 21c and between the piping boxes 21f and 21g respectively therebelow in each of which the process liquid pipe group 70 is horizontally placed. Each set of the SC1 pipes 70a, DHF pipes 70b, and so forth of the process liquid pipe groups 70 are connected by the bridging pipes to form a circulation pipe. The process liquid, such as SC1 or DHF, is supplied to the respective liquid processing units 22 individually from the circulation pipe, while it is circulated through the circulation pipe. In this case, the piping layout can be less complicate, so that the piping space becomes very compact with a simple piping layout.

Since the pipes are concentrated inside the piping boxes 21f and 21g and set to be compact, gas components present around the pipes can be exhausted together by a simple structure with an exhaust pipe. Where gas components present around the pipes are exhausted together, an efficient particle countermeasure is realized.

Clean air is supplied as a down flow from the fan/filter unit (FFU) 23 into the transfer chamber 21a, and is then exhausted, so that the interior of the transfer chamber 21a is kept clean. Further, this clean air is guided through the unit-accommodating chambers 21b and 21c into the driving areas 21d and 21e, and is then exhausted. This clean air is also guided into the liquid processing units to form a down flow. Consequently, a clean atmosphere is formed inside and around the liquid processing units 22, so the units 22 are prevented from being affected by particles.

A compact piping space thus formed allows the recycle tanks for recycling drainage to be disposed inside the system. Consequently, the entire system is very compact, even though the system can recycle drainage.

The present invention is not limited to the embodiment described above, and it may be modified in various manners. For example, the process liquids are not limited to SC1 and DHF described in the embodiment. The structure of the liquid processing units is not limited to that described in the embodiment, and it may be arranged to clean only one of the front and back surfaces of a wafer. Further, in place of a cleaning process, the present invention may be applied to a liquid processing unit for performing another liquid process, such as a resist liquid coating process and/or a subsequent development process. In the embodiment described above, the target substrate is exemplified by a semiconductor wafer, but the present invention may be applied to another substrate, such as a substrate for flat panel display devices (FPD), a representative of which is a glass substrate for liquid crystal display devices (LCD).

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A liquid processing system comprising:
a liquid processing section including a plurality of liquid processing units horizontally disposed therein and each configured to perform a liquid process while supplying a process liquid onto a substrate;
a process liquid storing section that stores the process liquid to be supplied to the liquid processing units of the liquid processing section;
a supply pipe configured to guide the process liquid from the process liquid storing section to the liquid processing units;
a drain pipe configured to guide the process liquid discharged from the liquid processing units;
an exhaust pipe configured to guide exhaust gas exhausted from the liquid processing units; and
a system casing that houses the liquid processing section, the process liquid storing section, the supply pipe, the drain pipe, and the exhaust pipe,
wherein the liquid processing system further comprises a common piping box horizontally disposed inside the system casing to partition an interior of the system casing into an upper space and a lower space such that the liquid processing section and the process liquid storing section are respectively present inside the upper space and the lower space,
the supply pipe, the drain pipe, and the exhaust pipe respectively include horizontal pipe portions gathered inside the common piping box and horizontally extending in parallel with each other along an array direction of the liquid processing units over all of the liquid processing units,
a box exhaust pipe is connected to the common piping box to exhaust gas from around the horizontal pipe portions inside the common piping box through the box exhaust pipe,
each of the liquid processing units is provided with a supply conduit, a drain conduit, and an exhaust conduit, which extend downward and respectively connect the liquid processing unit to the horizontal pipe portions of the supply pipe, the drain pipe, and the exhaust pipe,
the lower space includes a vertical pipe area present at an end of the process liquid storing section, and
the supply pipe includes a delivery pipe portion for delivering the process liquid from the process liquid storing section, the delivery pipe portion extending upward inside the vertical pipe area and connecting the process liquid storing section to the horizontal pipe portion of the supply pipe.

2. The liquid processing system according to claim 1, wherein the supply conduit is provided with a valve.

3. The liquid processing system according to claim 1, further comprising a recycling mechanism configured to collect and recycle at least part of the process liquid flowing through the drain pipe.

4. The liquid processing system according to claim 1, wherein the liquid processing section includes a unit-accommodating chamber in which the liquid processing units are arrayed, and a driving area in which driving systems of the plurality of the liquid processing units are disposed together, the driving area being interposed between the unit-accommodating chamber and the common piping box.

5. The liquid processing system according to claim 4, wherein a driving-area exhaust pipe is connected to the driving area to exhaust gas from inside the driving area through the driving-area exhaust pipe.

6. The liquid processing system according to claim 1, further comprising a substrate I/O section disposed outside the system casing and adjacent to the liquid processing section and configured to place thereon a substrate storage container for storing a plurality of substrates, wherein the substrate I/O section is configured to transfer a substrate from inside the substrate storage container to the liquid processing section, and to transfer a processed substrate from the liquid processing section into the substrate storage container.

7. The liquid processing system according to claim 1, wherein the plurality of liquid processing units comprise first and second rows of liquid processing units arrayed in parallel with each other,
the common piping box comprises first and second common piping boxes disposed along the first and second rows of liquid processing units, respectively,
each of the horizontal pipe portions of the supply pipe, the drain pipe, and the exhaust pipe comprises first and second horizontal pipe portions disposed inside the first and second common piping boxes, respectively, and horizontally extending along array directions of the first and second rows of liquid processing units over all of the first and second rows of liquid processing units, respectively,
the box exhaust pipe comprises exhaust pipes respectively connected to the first and second common piping boxes, and the first and second horizontal pipe portions of the supply pipe are connected to each other by a connecting pipe portion, such that the process liquid flows from the process liquid storing section, through the first horizontal pipe portion, the connecting pipe portion, and the second horizontal pipe portion of the supply pipe, in this order.

8. The liquid processing system according to claim 7, wherein the first horizontal pipe portion, the connecting pipe portion, and the second horizontal pipe portion of the supply pipe form a circulation passage for circulating the process liquid relative to the process liquid storing section.

9. The liquid processing system according to claim 7, further comprising:
a transfer chamber disposed inside the system casing to partition the liquid processing section into first and second liquid processing sections such that the first and second rows of liquid processing units are respectively present inside first and second liquid processing sections with the transfer chamber interposed therebetween; and
a transfer mechanism configured to travel along a transfer passage inside the transfer chamber to transfer a substrate to the first and second rows of liquid processing units.

10. The liquid processing system according to claim 9, wherein the connecting pipe portion extends below the transfer passage.

11. The liquid processing system according to claim 10, further comprising an exhaust space present below the transfer passage inside the system casing to partition the process liquid storing section into first and second process liquid storing sections wherein a transfer-system exhaust pipe is connected to the exhaust space to exhaust gas from inside the transfer chamber through the exhaust space and the transfer-system exhaust pipe.

12. The liquid processing system according to claim 10, wherein a piping area is arranged inside the system casing at a position adjacent to the process liquid storing section and below the transfer passage, and the connecting pipe portion extends through the piping area.

13. The liquid processing system according to claim 9, further comprising a fan/filter unit configured to supply clean air into the transfer chamber, wherein each of the liquid processing units comprises an inlet portion for introducing the clean air from the transfer chamber.

14. The liquid processing system according to claim 1, wherein each of the liquid processing units is a cleaning unit for performing a cleaning process as the liquid process on one substrate.

15. A liquid processing system comprising:
a liquid processing section including a plurality of liquid processing units horizontally disposed therein and each configured to perform a liquid process while supplying a process liquid onto a substrate, the plurality of liquid processing units comprising first and second rows of liquid processing units arrayed with a transfer passage interposed therebetween;
a transfer mechanism configured to travel along the transfer passage and to transfer a substrate to the first and second rows of liquid processing units;
a process liquid storing section that stores the process liquid to be supplied to the liquid processing units of the liquid processing section;
a supply pipe configured to guide the process liquid from the process liquid storing section to the processing units;
a drain pipe configured to guide the process liquid discharged from the liquid processing units;
an exhaust pipe configured to guide exhaust gas exhausted from the liquid processing units; and
a system casing that houses the liquid processing section, the process liquid storing section, the supply pipe, the drain pipe, and the exhaust pipe,
wherein the liquid processing system further comprises
first and second common piping boxes horizontally disposed inside the system casing to partition an interior of the system casing into an upper space and a lower space such that the liquid processing section and the process liquid storing section are respectively present inside the upper space and the lower space, and
a transfer chamber disposed inside the system casing to partition the liquid processing section into first and second liquid processing sections such that the first and second rows of liquid processing units are respectively present inside first and second liquid processing sections with the transfer chamber interposed therebetween and provided with the transfer passage and the transfer mechanism in the transfer chamber, and
wherein the supply pipe, the drain pipe, and the exhaust pipe respectively include first horizontal pipe portions gathered inside the first common piping box and second horizontal pipe portions gathered inside the second common piping box, the first and second horizontal pipe portions horizontally extending in parallel with each other along an array direction of the first and second rows of liquid processing units over all of the first and second rows of liquid processing units respectively,
box exhaust pipes are respectively connected to the first and second common piping boxes to exhaust gas from around the first and second horizontal pipe portions inside the first and second common piping boxes exhaust pipes,
each of the liquid processing units in the first row is provided with a supply conduit, a drain conduit, and an exhaust conduit, which extend downward and respectively connect this liquid processing unit to the first horizontal pipe portions of the supply pipe, the drain pipe, and the exhaust pipe, and each of the liquid processing units in the second row is provided with a supply conduit, a drain conduit, and an exhaust conduit, which extend downward and respectively connect this liquid processing unit to the second horizontal pipe portions of the supply pipe, the drain pipe, and the exhaust pipe,
the first and second horizontal pipe portions of the supply pipe are connected to each other by a connecting pipe portion, such that the process liquid flows from the process liquid storing section, through the first horizontal pipe portion, the connecting pipe portion, and the second horizontal pipe portion of the supply pipe, in this order, while the process liquid is supplied from the first and second horizontal pipe portions to the liquid processing units individually,
the lower space includes a vertical pipe area present at an end of the process liquid storing section, and
the supply pipe includes a delivery pipe portion for delivering the process liquid from the process liquid storing section, the delivery pipe portion extending upward inside the vertical pipe area and connecting the process liquid storing section to the first horizontal pipe portion of the supply pipe.

16. The liquid processing system according to claim 15, wherein the first horizontal pipe portion, the connecting pipe portion, and the second horizontal pipe portion of the supply pipe form a circulation passage for circulating the process liquid relative to the process liquid storing section.

17. The liquid processing system according to claim 15, wherein the connecting pipe portion extends below the transfer passage.

18. The liquid processing system according to claim 17, wherein a piping area is arranged inside the system casing at a position adjacent to the process liquid storing section and below the transfer passage, and the connecting pipe portion extends through the piping area.

19. The liquid processing system according to claim 15, further comprising a fan/filter unit configured to supply clean air into the transfer chamber, wherein each of the liquid processing units comprises an inlet portion for introducing the clean air from the transfer chamber.

20. The liquid processing system according to claim 15, further comprising an exhaust space present below the transfer passage inside the system casing to partition the process liquid storing section into first and second process liquid storing sections wherein a transfer-system exhaust pipe is connected to the exhaust space to exhaust gas from inside the transfer chamber through the exhaust space and the transfer-system exhaust pipe.

* * * * *